United States Patent
You et al.

(10) Patent No.: US 8,738,174 B2
(45) Date of Patent: May 27, 2014

(54) SUBSTRATE PROCESSING APPARATUS AND METHOD FOR LOADING AND UNLOADING SUBSTRATES

(75) Inventors: Jaehyun You, Cheonan-si (KR); Kyo Woog Koo, Cheonan-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 205 days.

(21) Appl. No.: 13/161,824

(22) Filed: Jun. 16, 2011

(65) Prior Publication Data

US 2011/0313565 A1 Dec. 22, 2011

(30) Foreign Application Priority Data

Jun. 17, 2010 (KR) .................. 10-2010-0057707

(51) Int. Cl.
- *G06F 7/00* (2006.01)
- *G06F 19/00* (2011.01)
- *B65G 53/46* (2006.01)
- *B65G 21/02* (2006.01)
- *B65H 1/00* (2006.01)

(52) U.S. Cl.
USPC ........... 700/218; 700/213; 700/214; 700/112; 700/230; 700/245; 414/217; 414/416.03; 414/222.01; 901/40

(58) Field of Classification Search
None
See application file for complete search history.

(56) References Cited

U.S. PATENT DOCUMENTS

| 2006/0251499 A1* | 11/2006 | Lunday et al. ............... 414/217 |
| 2009/0082895 A1* | 3/2009 | Barker et al. ................. 700/112 |
| 2010/0080673 A1* | 4/2010 | Von Der Waydbrink et al. ............ 414/222.01 |

FOREIGN PATENT DOCUMENTS

| JP | 57-211746 | 12/1982 | |
| JP | 57211746 A * | 12/1982 | .............. H01L 21/68 |
| JP | 2001-053310 | 2/2001 | |
| JP | 2001053310 A * | 2/2001 | .............. H01L 31/04 |
| JP | 2004-284772 A | 10/2004 | |
| KR | 10-2004-0086092 | 10/2004 | |
| KR | 20080104493 A | 12/2008 | |
| KR | 10-2010-0033283 | 3/2010 | |
| KR | 101027050 | 3/2011 | |

* cited by examiner

*Primary Examiner* — Yolanda Cumbess
(74) *Attorney, Agent, or Firm* — Harness, Dickey & Pierce, P.L.C.

(57) ABSTRACT

Provided is a substrate processing apparatus for loading substrates such as solar cell substrates on a tray in substrate processing equipment for processing a large number of substrates. The substrate processing apparatus includes: a tray carrying unit configured to receive and carry a tray; a substrate loading conveyor unit on which substrates to be loaded on a tray are arranged in a line; a substrate unloading conveyor unit on which substrates unloaded from a tray are arranged in a line; a first substrate carrying robot configured to pick up substrates from the substrate loading conveyor unit and carry the substrates to a tray placed on the tray carrying unit; and a second substrate carrying robot configured to pick up substrates from a tray placed on the tray carrying unit and carry the substrates to the substrate unloading conveyor unit.

21 Claims, 10 Drawing Sheets

SUBSTRATE PROCESSING APPARATUS AND METHOD FOR LOADING AND UNLOADING SUBSTRATES

CROSS-REFERENCE TO RELATED APPLICATIONS

This U.S. non-provisional patent application claims priority under 35 U.S.C. §119 of Korean Patent Application No. 10-2010-0057707, filed on Jun. 17, 2010, the entire contents of which are hereby incorporated by reference.

BACKGROUND OF THE INVENTION

The present invention disclosed herein relates to a substrate processing apparatus and method for processing a large number of substrates such as solar cell substrates, and more particularly, to a substrate processing apparatus and method for loading substrates on a tray.

Concern on environment and energy depletion has made people interested in inexhaustible, clean, and efficient solar energy.

Applications of solar energy can be classified into solar thermal systems that generate steam using solar energy to rotate turbines; and solar cells that convert sunlight (photons) into electric energy by using semiconductors. Particularly, much research is being conducted on solar cells that convert solar energy into electric energy by absorbing light and producing electrons and holes using the absorbed light.

In a manufacturing process of solar cells, thin films such as p-type or n-type semiconductor layers, anti-reflection layers, and electrodes are deposited on substrates such as silicon wafers. In a thin film deposition apparatus for performing such a manufacturing process of solar cells, trays are used to process many solar cells at a time.

However, in a substrate processing apparatus for manufacturing solar cells, it takes much time to load and unload many solar cells on a tray. Therefore, due to low work efficiency, tact time is increased, and thus productivity is lowered.

SUMMARY OF THE INVENTION

The present invention provides a substrate processing apparatus and method for rapidly loading and unloading solar cells on and from a tray.

The present invention also provides a substrate processing apparatus and method that can improve productivity.

Embodiments of the present invention provide substrate processing apparatuses for loading and unloading a plurality of substrates on and from a tray, the substrate processing apparatuses including: a tray carrying unit configured to receive and carry a tray; a substrate loading conveyor unit on which substrates to be loaded on a tray are arranged in a line; a substrate unloading conveyor unit on which substrates unloaded from a tray are arranged in a line; a first substrate carrying robot configured to pick up substrates from the substrate loading conveyor unit and carry the substrates to a tray placed on the tray carrying unit; and a second substrate carrying robot configured to pick up substrates from a tray placed on the tray carrying unit and carry the substrates to the substrate unloading conveyor unit.

In some embodiments, the substrate loading conveyor unit and the substrate unloading conveyor unit are symmetrically disposed at both sides of the tray carrying unit.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The objects, means to solve the objects, and effects of the present invention will be readily understood through embodiments related to the accompanying drawings. Each figure may be partly simplified or exaggerated for clarity of illustration. Like reference numerals refer to like elements throughout. Moreover, detailed descriptions related to well-known functions or configurations will be ruled out in order not to unnecessarily obscure subject matters of the present invention.

Figure 1:
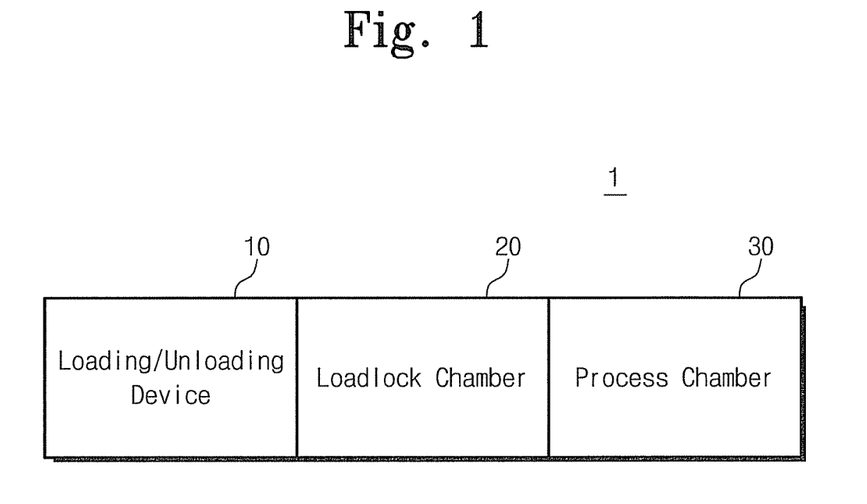
FIG. 1 is a block diagram illustrating plasma enhanced chemical vapor deposition (PECVD) equipment for solar cells according to an embodiment of the present invention.
Figure 2:
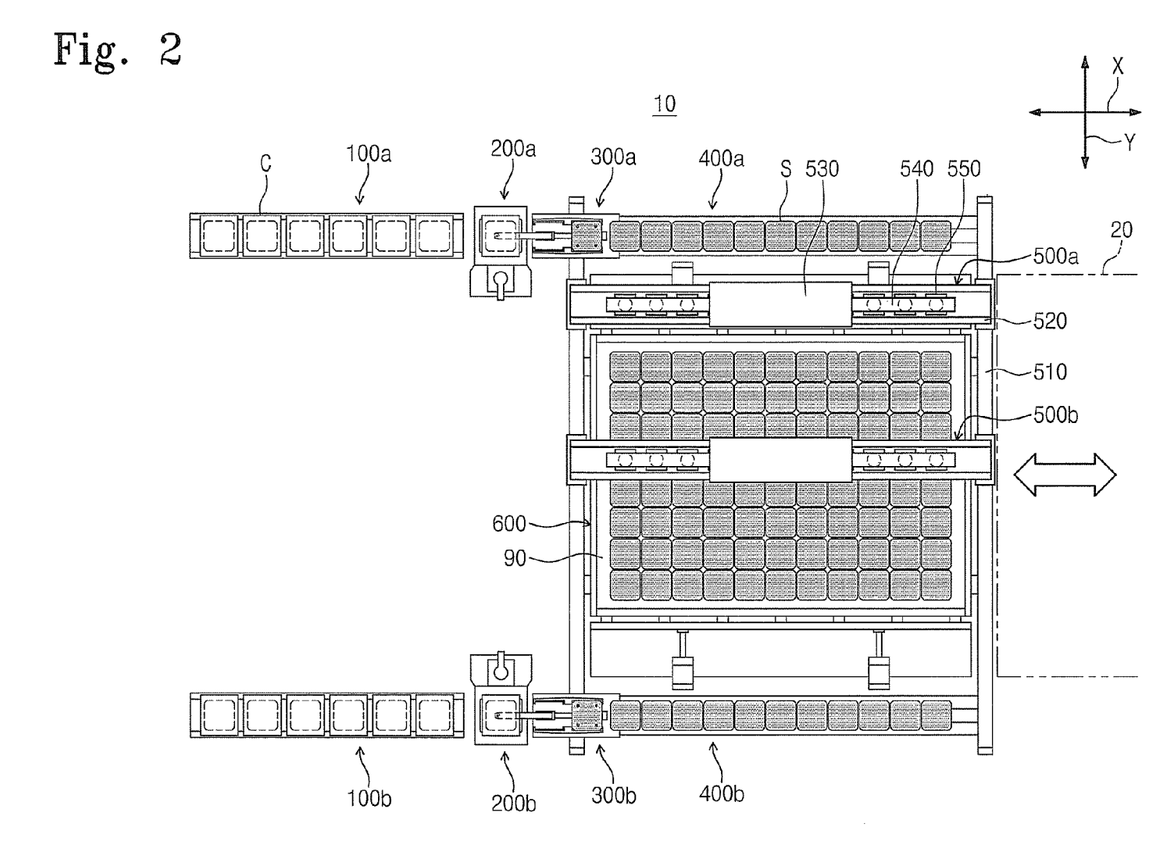
FIG. 2 is a plan diagram view illustrating a loading/unloading device of FIG. 1 according to an embodiment of the present invention.

FIG. 1 is a block diagram illustrating plasma enhanced chemical vapor deposition (PECVD) equipment 1 for solar cells according to an embodiment of the present invention, and FIG. 2 is a plan diagram view illustrating a loading/unloading device 10 depicted in FIG. 1 according to an embodiment of the present invention.

Referring to FIGS. 1 and 2, the PECVD equipment 1 is used to perform a PECVD process on solar-cell substrates (S) (hereinafter, referred to as substrates (S)). The PECVD equipment 1 includes the loading/unloading device 10, a loadlock chamber 20, and a process chamber 30.

According to an embodiment of the present invention, a plurality of substrates (S) can be processed together to increase productivity. For example, several tens to several hundreds of substrates (S) may be placed on a tray 90. That is, in a state where a plurality of substrates (S) are placed on a tray 90, the tray 90 is carried into the process chamber 30 through the loadlock chamber 20, and then a predetermined process is performed on the substrates (S) placed on the tray 90.

According to an embodiment of the present invention, a tray transfer unit is used to carry a tray 90 into the process chamber 30 and from the process chamber 30. The tray transfer unit may be an inline type (conveyor type) tray transfer unit including feed rollers, or may be a robot type tray transfer unit configured to pick up a tray 90 and move the tray 90. In the embodiments shown in the drawings, an inline type tray transfer unit including feed rollers is used. The loading/unloading device 10 of the PECVD equipment 1 includes a substrate carrying unit to carry substrates (S) onto a tray 90 (loading) and carry substrates (S) from a tray 90 (unloading).

The loadlock chamber 20 is provided as a buffer space between the loading/unloading device 10 kept in an atmospheric state and the process chamber 30 kept in a vacuum state. When a tray 90 is carried between the loading/unloading device 10 and the loadlock chamber 20, the loadlock chamber 20 is kept at an atmospheric pressure, and when the tray 90 is carried between the loadlock chamber 20 and the process chamber 30, the loadlock chamber 20 is kept in a vacuum state. Feed rollers (not shown) are arranged in the loadlock chamber 20 to move a tray 90 onto or from feed roller tracks of the loading/unloading device 10.

In the process chamber 30, a PECVD process may be processed on substrates (S) in a vacuum state to form thin films such as p-type or n-type semiconductor layers, antireflection layers, and electrodes on the substrates (S).

Referring again to FIG. 2, the loading/unloading device 10 is disposed in front of a substrate entrance of the loadlock chamber 20 to load substrates (S) on a tray 90 or unload processed substrates (S) from a tray 90. In the embodiment shown in FIG. 2, eighty eight substrates (S) may be placed on a tray 90 in eight rows (x-axis direction) and eleven columns (y-axis direction) (8*11=88).

The loading/unloading device 10 includes a cassette loading conveyor unit 100a, a first cassette elevator 200a, a substrate carrying-out unit 300a, a substrate loading conveyor unit 400a, a first substrate carrying robot 500a, a tray carrying unit 600, a cassette unloading conveyor unit 100b, a second cassette elevator 200b, a substrate carrying-in unit 300b, a substrate unloading conveyor unit 400b, and a second substrate carrying robot 500b.

Figure 3:
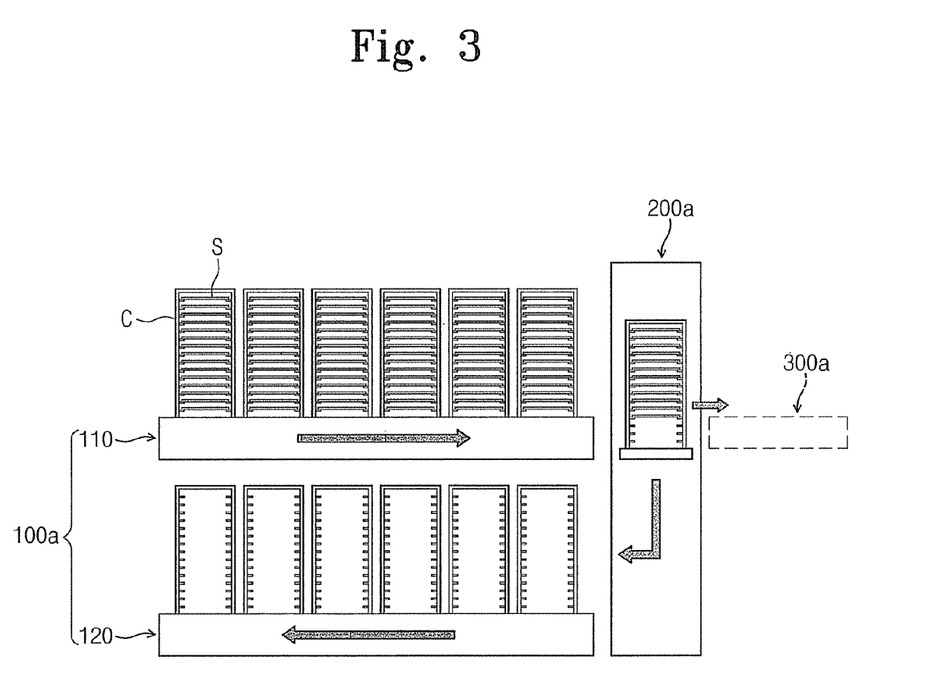
FIG. 3 is a diagram illustrating a cassette loading conveyor unit according to an embodiment of the present invention.

FIG. 3 is a diagram illustrating the cassette loading conveyor unit 100a according to an embodiment of the present invention.

Referring to FIGS. 2 and 3, the cassette loading conveyor unit 100a has a two-stage structure constituted by an upper conveyor 110 on which cassettes (C) containing substrates (S) are placed and a lower conveyor 120 on which empty cassettes (C)s are placed. The upper conveyor 110 supplies cassettes (C) containing non-processed substrates (S) to the first cassette elevator 200a, and the lower conveyor 120 receives empty cassettes (C) from the first cassette elevator 200a. The cassette unloading conveyor unit 100b supplies empty cassettes (C) to the second cassette elevator 200b and receives cassettes (C) containing processed substrates (S) from the second cassette elevator 200b. The cassette unloading conveyor unit 100b may have the same structure as the cassette loading conveyor unit 100a.

The first cassette elevator 200a is operated in association with the substrate carrying-out unit 300a. That is, the first cassette elevator 200a raises or lowers a cassette (C) when the substrate carrying-out unit 300a carries substrates (S) from the cassette (C). The second cassette elevator 200b is operated in association with the substrate carrying-in unit 300b. That is, the second cassette elevator 200b raises or lowers a cassette (C) when the substrate carrying-in unit 300b carries substrates (S) in the cassette (C). The second cassette elevator 200b may have the same structure as the first cassette elevator 200a.

The substrate carrying-out unit 300a and the substrate carrying-in unit 300b have the same structure. However, the substrate carrying-out unit 300a and the substrate carrying-in unit 300b have different functions: the substrate carrying-out unit 300a takes substrates (S) out of a cassette (C) and supplies the substrates (S) to the substrate loading conveyor unit 400a, and the substrate carrying-in unit 300b carries substrates (S) from the substrate unloading conveyor unit 400b into a cassette (C).

Figure 4A:
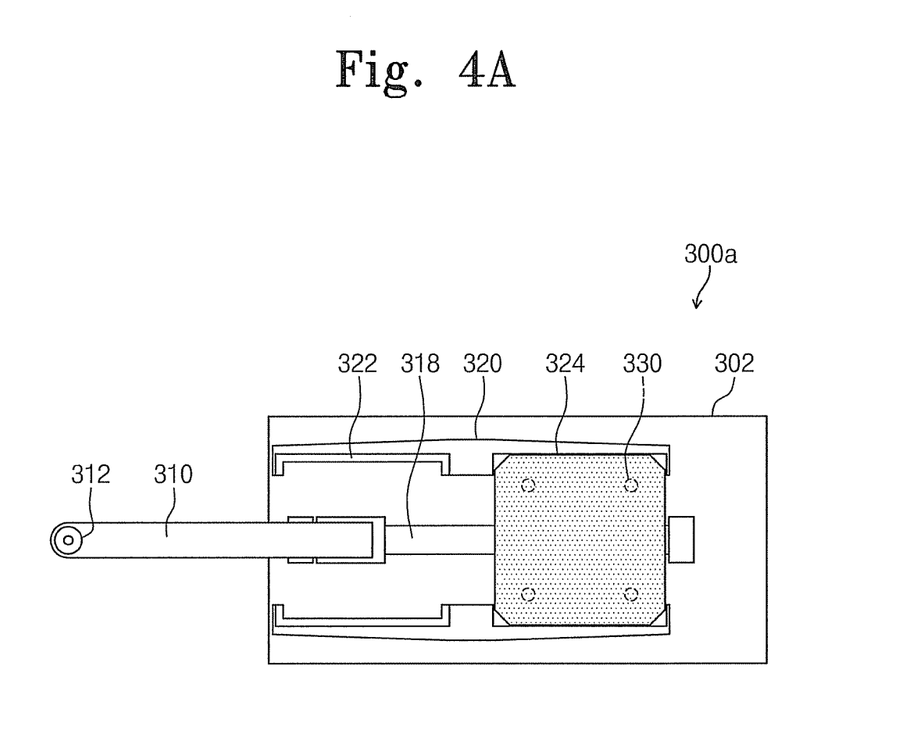
FIG. 4A is a diagram illustrating a substrate carrying-out unit according to an embodiment of the present invention.

FIG. 4A is a diagram illustrating the substrate carrying-out unit 300a according to an embodiment of the present invention.

Referring to FIGS. 2 and 4A, the substrate carrying-out unit 300a includes a base plate 302, an end effector 310, and a substrate shift module 320. The end effector 310 is disposed on the base plate 302. The end effector 310 can be moved forward and backward in the x-axis direction (refer to FIG. 2) by a cylinder unit 318. The end effector 310 includes a vacuum holder 312 at an end thereof so as to hold a substrate (S) by vacuum.

As the end effector 310 is moved forward (refer to the first illustration in FIG. 4B), the vacuum holder 312 is inserted in a cassette (C) placed on the first cassette elevator 200a. Then, in response to the forward movement of the end effector 310, the first cassette elevator 200a moves down a predetermined length so that a substrate (S) can be placed on the vacuum holder 312 of the end effector 310. That is, as the first cassette elevator 200a moves down, one of substrates (S) contained in the cassette (C) is held by vacuum on the vacuum holder 312 of the end effector 310. Then, the end effector 310 is moved backward (refer to the second illustration in FIG. 4B) to place the substrate (S) on a first seat 322 of the substrate shift module 320.

The substrate shift module 320 is disposed on the base plate 302. The substrate shift module 320 includes first and second seats 322 and 324 that are symmetrically formed in one piece. The substrate shift module 320 is moved forward and backward by a first distance (shift distance) and upward and downward so as to move a substrate (S) from the first seat 322 to substrate support pins 330 disposed inside the second seat 324 and deliver, a substrate (S) that was placed on the substrate support pins 330 to a conveyor 410 of the substrate loading conveyor unit 400a. The substrate shift module 320 may be moved forward, backward, upward, and downward by general linear driving units such as a cylinder unit and a motor unit.

That is, as a result of operation of the substrate shift module 320, a substrate (S) taken from a cassette (C) by the end effector 310 is placed on a standby position (the substrate support pins 330), and a substrate (S) (standby substrate (S)) that was placed on the substrate support pins 330 is carried to the conveyor 410 of the substrate loading conveyor unit 400a.

Figure 4B:
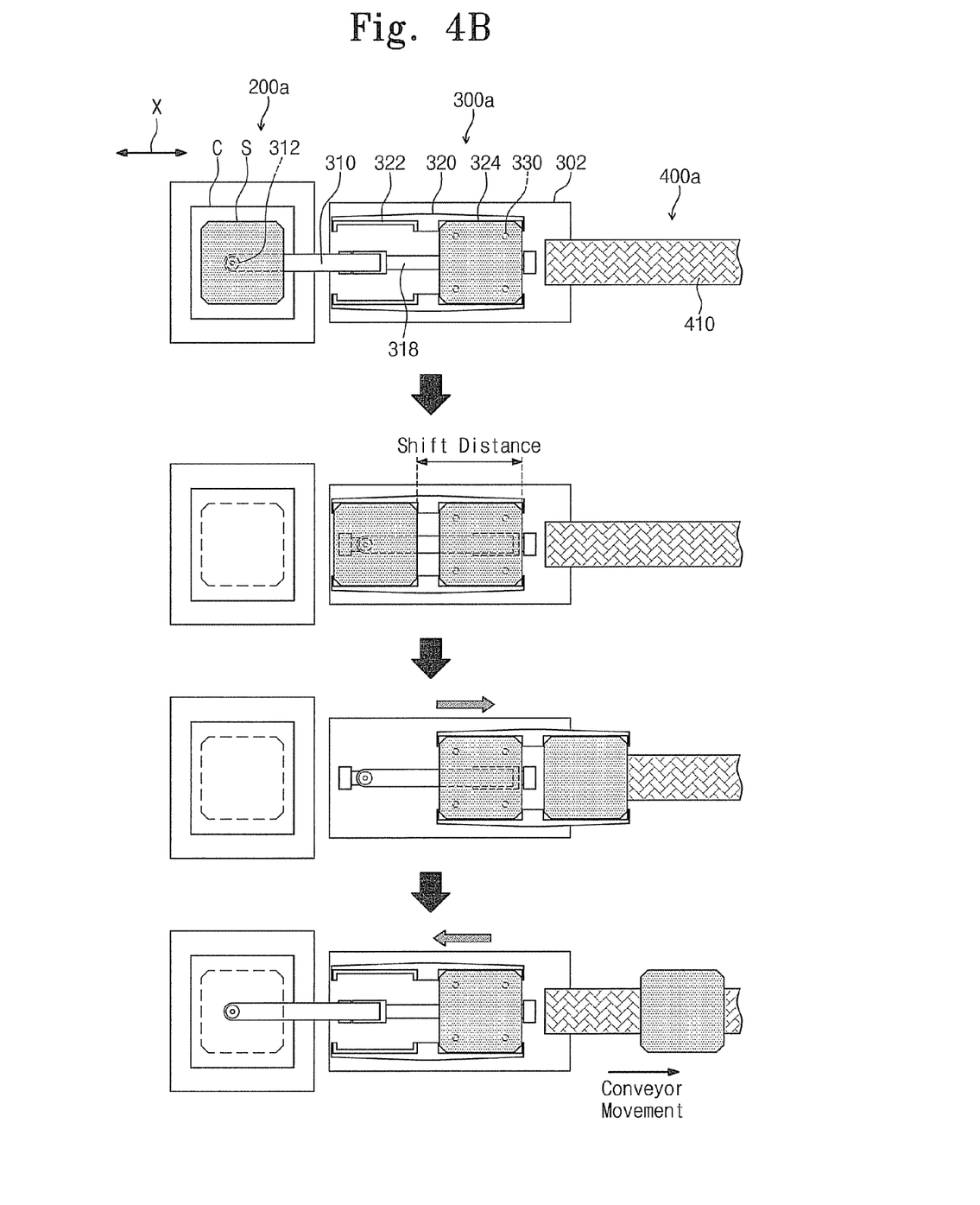
FIG. 4B is a diagram for explaining how a substrate is carried out from the substrate carrying-out unit according to an embodiment of the present invention.

FIG. 4B is a diagram for explaining how a substrate (S) is carried out from the substrate carrying-out unit 300a according to an embodiment of the present invention.

Referring to FIG. 4B, a substrate (S) contained in a cassette (C) is vacuum-held on the vacuum holder 312 by a forward movement of the end effector 310 and a vertical movement of the first cassette elevator 200a. Then, the end effector 310 is moved backward to place the substrate (S) above the first seat 322 of the substrate shift module 320. At this time, the substrate shift module 320 is placed at a standby position lower than the substrate (S) held on the end effector 310 and a substrate support height of the substrate support pins 330. Next, the substrate shift module 320 is moved upward to move the substrate (S) from the end effector 310 to the first seat 322 of the substrate shift module 320. At this time, the substrate shift module 320 is moved upward to a position higher than the substrate (S) placed on the end effector 310 and the substrate support height of the substrate support pins 330. In addition, a standby substrate (S) that was placed on the substrate support pins 330 is placed on the second seat 324 of the substrate shift module 320 by the upward movement of the substrate shift module 320. Next, the substrate shift module 320 is moved by a shift distance to transfer the substrate (S) placed on the first seat 322 to an upper side of the substrate support pins 330 and the standby substrate (S) placed on the second seat 324 to an upper side of the substrate loading conveyor unit 400a. Next, the substrate shift module 320 is moved downward to place the substrate (S) on the substrate support pins 330 and the standby substrate (S) on the conveyor 410 of the substrate loading conveyor unit 400a. Thereafter, the conveyor 410 is shifted to receive the next substrate (S). Next, the substrate shift module 320 is shifted to an original standby position (original position). Then, the end effector 310 is operated again in the same way so as to take another substrate (S) from the cassette (C) and place the substrate (S) above the first seat 322. If the substrate carrying-out unit 300a is operated twelve times in this way, eleven substrates (S) are placed in a line on the conveyor 410 of the substrate loading conveyor unit 400a.

Figure 5:
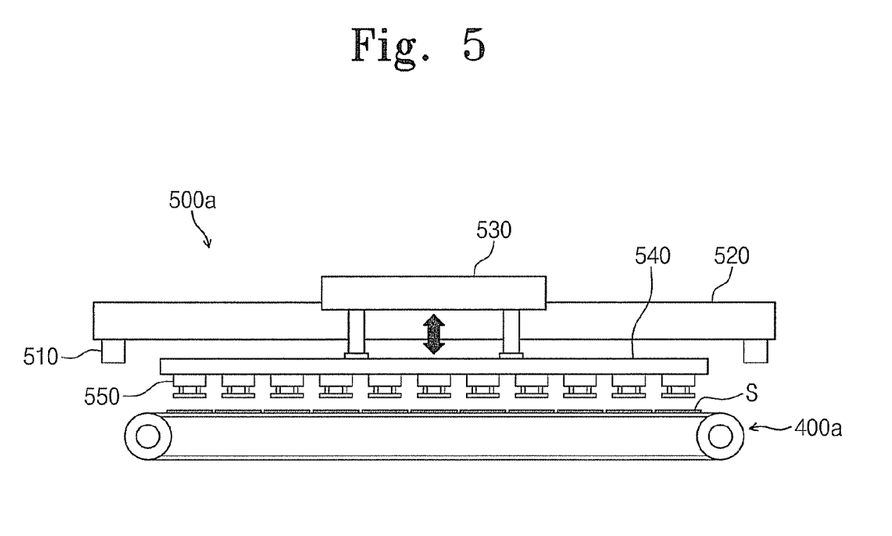
FIG. 5 is a diagram illustrating a first substrate carrying robot according to an embodiment of the present invention.

FIG. 5 is a diagram illustrating the first substrate carrying robot 500a according to an embodiment of the present invention.

Referring to FIGS. 2 and 5, the first substrate carrying robot 500a includes: a pair of transfer rails 510 disposed at both sides above the tray carrying unit 600; a movable frame 520 movable along the transfer rails 510 in the y-axis direction; and a chuck unit disposed on the movable frame 520. The chuck unit includes: eleven Bernoulli chucks 550 configured to hold substrates (S) from the top sides of the substrates (S) by a non-contact type method using Bernoulli's principle; a support frame 540 on which the Bernoulli chucks 550 are disposed; and an elevation driving unit 530 configured to raise and lower the support frame 540.

FIG. 6A through 6E are diagrams for explaining how a tray 90 is moved from lower feed roller tacks to upper feed roller tracks.

Figure 6A:
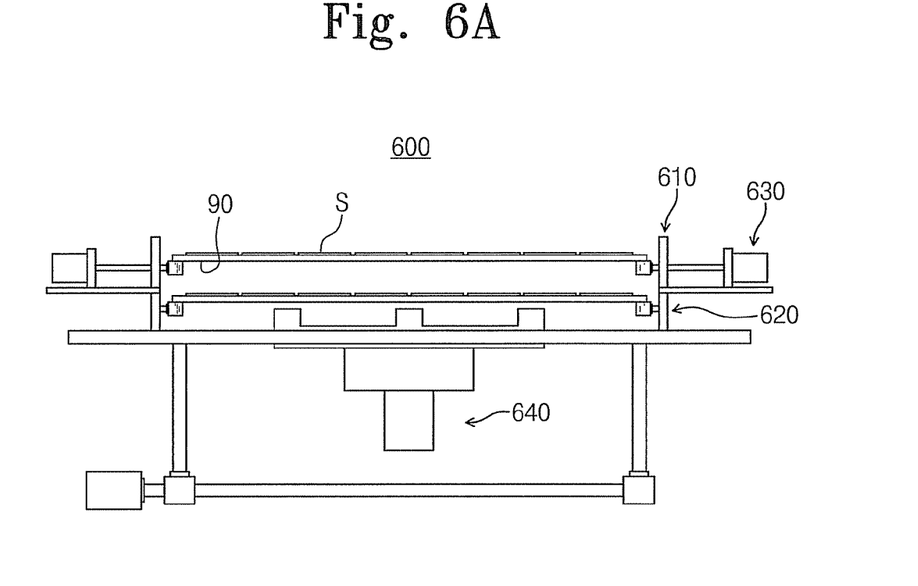
FIGS. 6A through 6E are diagrams for explaining how a tray is moved from lower feed roller tracks to upper feed roller tracks.

Referring to FIGS. 2 and 6A, the tray carrying unit 600 is used to move a tray 90 into and from the loadlock chamber 20. The tray carrying unit 600 includes: upper and lower feed roller tracks 610 and 620 arranged in two stages along both sides of a tray carrying path parallel to the x-axis direction; an open driving unit 630 configured to move the upper feed roller tracks 610; and a tray lift unit 640 configured to lift a tray 90 from the lower feed roller tracks 620 to the upper feed roller tracks 610. The lower feed roller tracks 620 receive a tray 90 from the loadlock chamber 20, and the upper feed roller tracks 610 feed a tray 90 to the loadlock chamber 20. Rollers 12 of the upper and lower feed roller tracks 610 and 620 are driven by a roller driving unit (not shown).

Figure 6B:
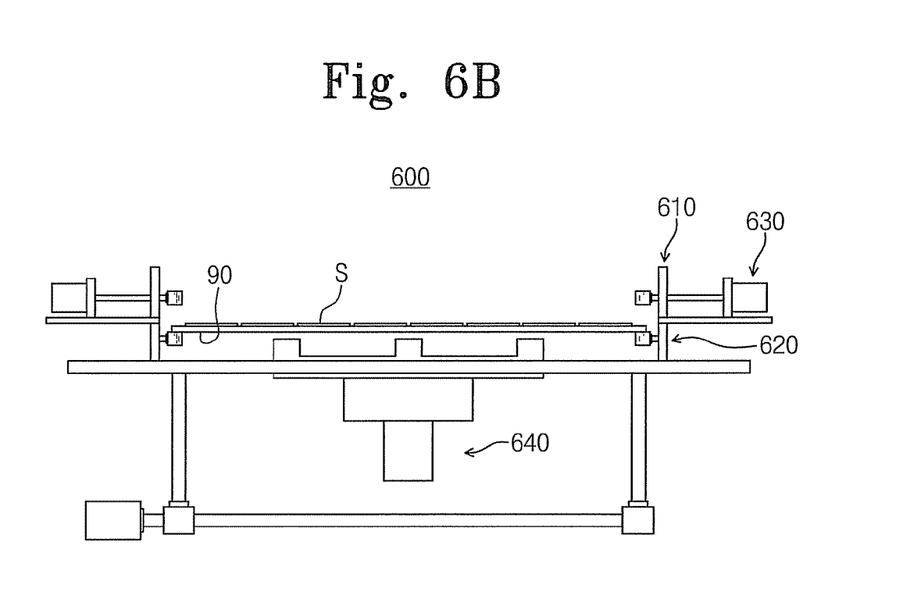
Figure 6C:
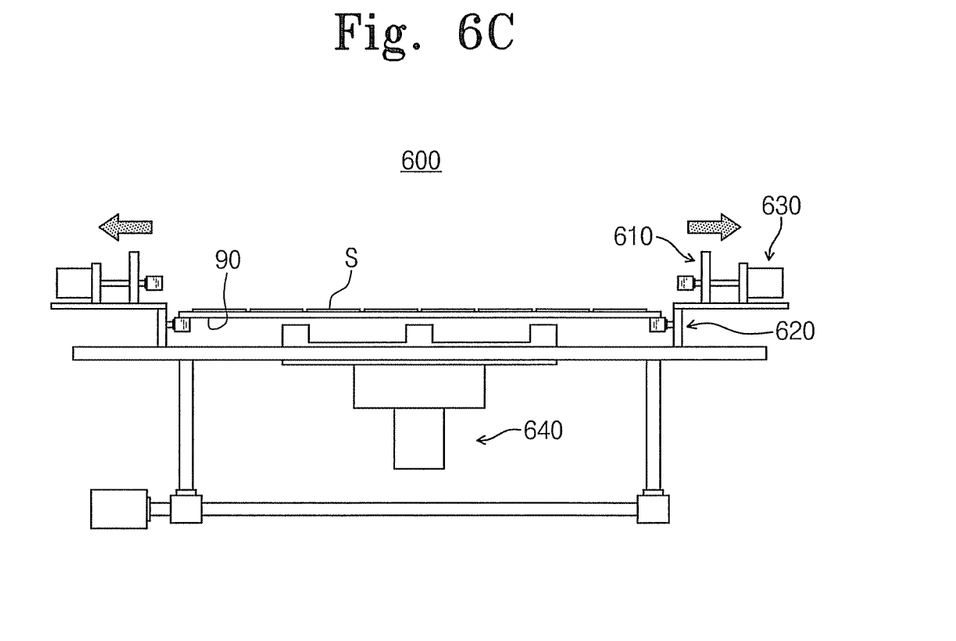
Figure 6D:
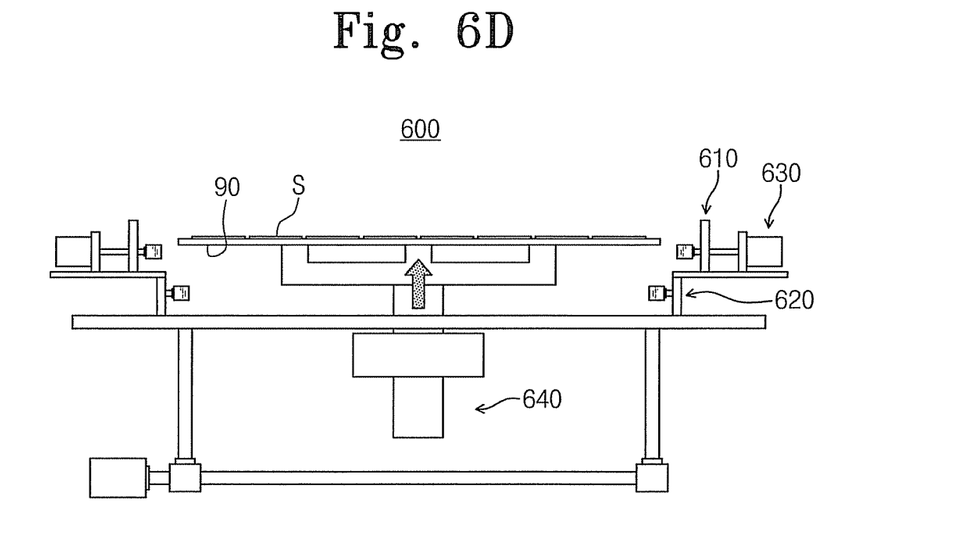
Figure 6E:
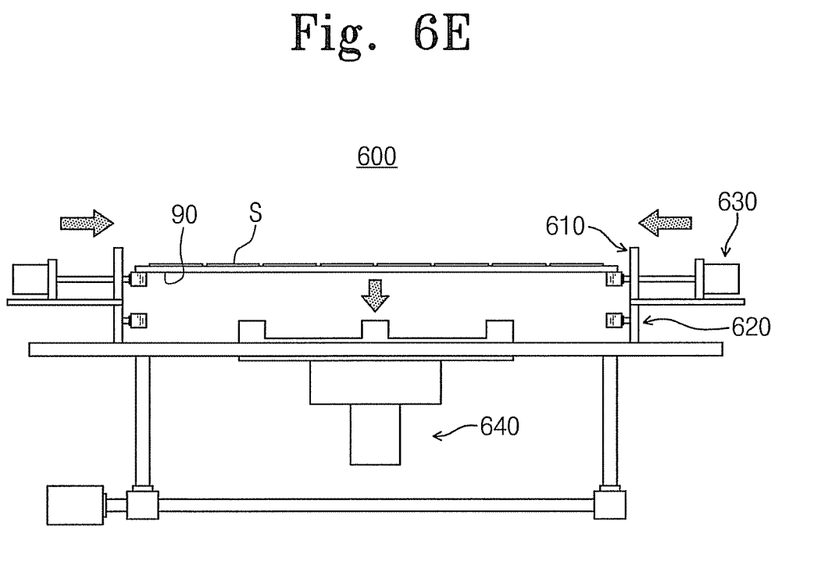

A tray 90 is delivered from the lower feed roller tracks 620 to the upper feed roller tracks 610 as follows.

Referring to FIGS. 6A and 6E, after substrates (S) of a tray 90 placed on the upper feed roller tracks 610 are replaced (FIG. 6A), the upper feed roller tracks 610 carry the tray 90 to the loadlock chamber 20. Then, no tray 90 is placed on the upper feed roller tracks 610 (FIG. 6B). Thereafter, the upper feed roller tracks 610 are sufficiently moved outward to both sides so that a standby tray 90 placed on the lower feed roller tracks 620 can be moved upward (FIG. 6C). The tray lift unit 640 lifts the standby tray 90 from the upper feed roller tracks 610 (FIG. 6D). After the standby tray 90 is lifted, the upper feed roller tracks 610 are moved to original positions by the open driving unit 630. Then, the tray lift unit 640 moves downward to transfer the standby tray 90 supported by the tray lift unit 640 to the upper feed roller tracks 610 (FIG. 6E).

Substrates (S) are loaded on and unloaded from the loading/unloading device 10 (described with reference to FIG. 2) as follows. The first substrate carrying robot 500a picks up eleven substrates (S) from a first row of substrates (S) of a tray 90 placed on the upper feed roller tracks 610 of the tray carrying unit 600, and then the first substrate carrying robot 500a carries the picked-up substrates (S) to the substrate unloading conveyor unit 400b. Along with this, the second substrate carrying robot 500b picks up eleven substrates (S) from the substrate loading conveyor unit 400a (at the time when the first substrate carrying robot 500a picks up the first row of substrates (S) from the tray 90), and the second substrate carrying robot 500b carries the substrates (5) to the empty first row of the tray 90. In this way, the first and second substrate carrying robots 500a and 500b can be simultaneously operated to load and unload substrates (S). Alternatively, the first and second substrate carrying robots 500a and 500b may be individually operated to load and unload substrates (S).

As described above, according to the present invention, loading and unloading of substrates (S) can be simultaneously carried out by using the loading/unloading device 10, and thus standby time can be reduced to increase the productivity by about 40%.

Figure 7:
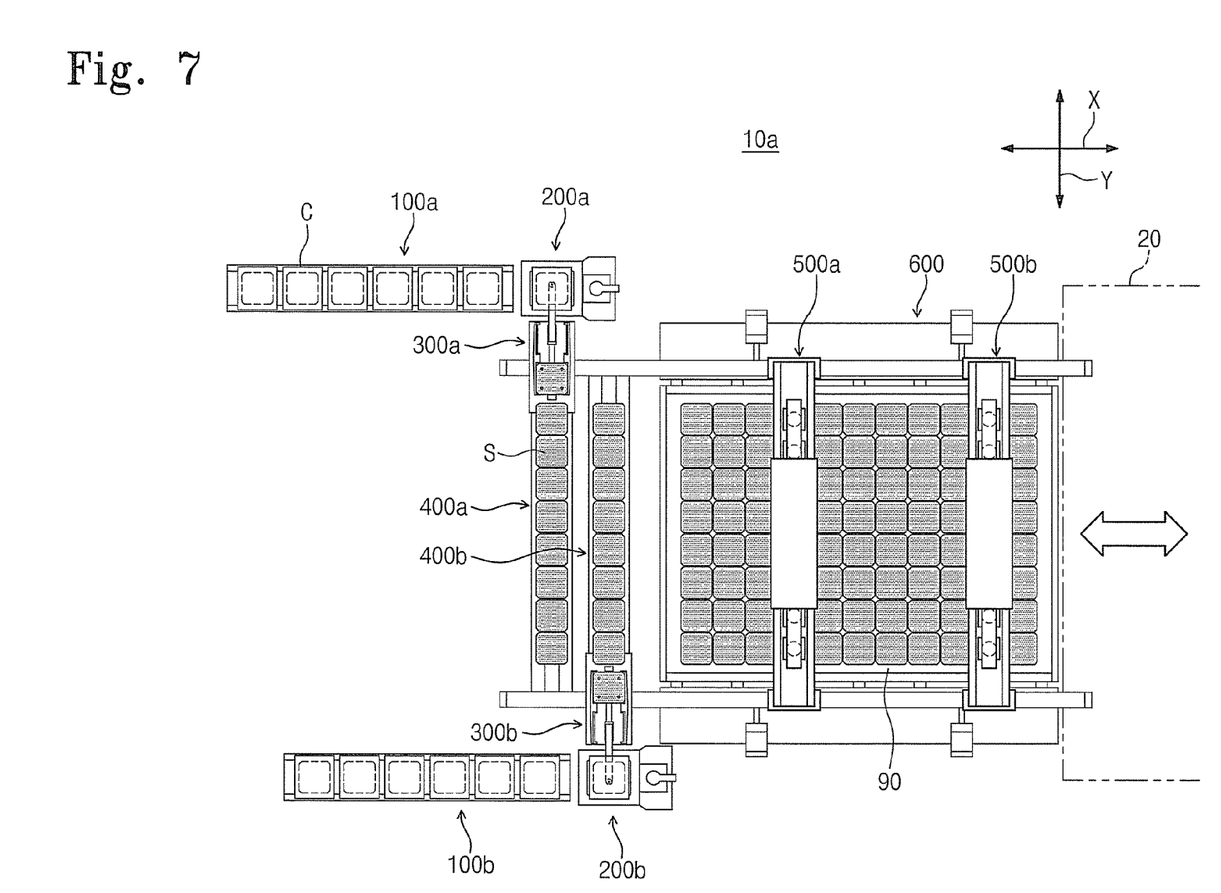
FIG. 7 is a plan diagram illustrating a modification example of the loading/unloading device according to another embodiment of the present invention.

FIG. 7 is a plan diagram illustrating a modification example 10a of the loading/unloading device 10 according to another embodiment of the present invention.

The loading/unloading device 10a shown in FIG. 7 has the same structure as the loading/unloading device 10 shown in FIG. 2 except that the substrate loading conveyor unit 400a and the substrate unloading conveyor unit 400b are disposed in front of the tray carrying unit 600 in a vertical direction (y-axis direction) instead of a horizontal direction (x-axis direction). As a result, the first and second substrate carrying robots 500a and 500b are configured to be moved in the x-axis direction so as to carry vertical lines (columns) of substrates (S). In this case, eight substrates (S) are arranged on each of the substrate loading conveyor unit 400a and the substrate unloading conveyor unit 400b, and each of the first and second substrate carrying robots 500a and 500b includes eight Bernoulli chucks 550 to carry eight substrates (S) at a time.

As described above, solar cells can be rapidly loaded and unloaded on and from a tray, and thus the productivity can be improved.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate processing apparatus for loading and unloading a plurality of substrates on and from a tray, the substrate processing apparatus comprising:
   a tray carrying unit configured to receive and carry a tray;
   a substrate loading conveyor unit on which substrates to be loaded on a tray are arranged in a line;
   a substrate unloading conveyor unit on which substrates unloaded from a tray are arranged in a line;
   a first substrate carrying robot configured to pick up substrates from the substrate loading conveyor unit and carry the substrates to a tray placed on the tray carrying unit, wherein the first substrate carrying robot includes,
   a pair of transfer rails disposed at both sides above the tray carrying unit,
   a movable frame movable along the transfer rails, and a chuck unit disposed on the movable frame and configured to hold substrates, the chuck unit including,
a support frame on which Bernoulli chucks are disposed to hold substrates from top surfaces of the substrates by a non-contact method; and
an elevation driving unit configured to move the support frame upward and downward; and
a second substrate carrying robot configured to pick up substrates from a tray placed on the tray carrying unit and carry the substrates to the substrate unloading conveyor unit.

2. The substrate processing apparatus of claim 1, wherein the second substrate carrying robot comprises:
a pair of transfer rails disposed at both sides above the tray carrying unit;
a movable frame movable along the transfer rails; and
a chuck unit disposed on the movable frame and configured to hold substrates.

3. The substrate processing apparatus of claim 1, further comprising:
a second cassette elevator configured to receive and lift an empty cassette; and
a substrate carrying-in unit configured to take substrates from the substrate unloading conveyor unit and place the substrates in an empty cassette placed on the second cassette elevator.

4. The substrate processing apparatus of claim 1, wherein the substrate loading conveyor unit and the substrate unloading conveyor unit are symmetrically disposed with respect to the tray carrying unit.

5. The substrate processing apparatus of claim 1, wherein the substrate loading conveyor unit and the substrate unloading conveyor unit are disposed in front of the tray carrying unit and are parallel with each other.

6. The substrate processing apparatus of claim 5, wherein the first and second substrate carrying robots are horizontally movable to carry vertical columns of substrates.

7. The substrate processing apparatus of claim 1, wherein the first substrate carrying robot is configured to load a first plurality of substrates and the second substrate carrying robot is configured to unload a second plurality of substrates.

8. The substrate processing apparatus of claim 7, wherein the first and second plurality of substrates are first and second sets of substrates arranged in at least one of a vertical and a horizontal direction.

9. The substrate processing apparatus of claim 7, wherein the first and second substrate carrying robots are configured to operate simultaneously.

10. A substrate processing apparatus for loading and unloading a plurality of substrates on and from a tray, the substrate processing apparatus comprising:
a tray carrying unit configured to receive and carry a tray, the tray carrying unit including,
upper feed roller tracks arranged at both sides of a tray carrying path in parallel with the tray carrying path,
lower feed roller tracks arranged under the upper feed roller tracks at both sides of the tray carrying path in parallel with the tray carrying path,
a tray lift unit configured to lift a tray from the lower feed roller tracks to the upper feed roller tracks, and
an open driving unit configured to move the upper feed roller tracks to provide a sufficient space when a tray is lifted by the tray lift unit;
a substrate loading conveyor unit on which substrates to be loaded on a tray are arranged in a line;
a substrate unloading conveyor unit on which substrates unloaded from a tray are arranged in a line;
a first substrate carrying robot configured to pick up substrates from the substrate loading conveyor unit and carry the substrates to a tray placed on the tray carrying unit; and
a second substrate carrying robot configured to pick up substrates from a tray placed on the tray carrying unit and carry the substrates to the substrate unloading conveyor unit.

11. The substrate processing apparatus of claim 1, further comprising:
a first cassette elevator configured to receive and lift a cassette containing substrates; and
a substrate carrying-out unit configured to take substrates from a cassette placed on the first cassette elevator and provide the substrates to the substrate loading conveyor unit.

12. The substrate processing apparatus of claim 11, wherein the first cassette elevator, the substrate carrying-out unit, and the substrate loading conveyor unit are straightly arranged in a line.

13. A substrate processing apparatus for loading and unloading a plurality of substrates on and from a tray, the substrate processing apparatus comprising:
a tray carrying unit configured to receive and carry a tray;
a substrate loading conveyor unit on which substrates to be loaded on a tray are arranged in a line;
a substrate unloading conveyor unit on which substrates unloaded from a tray are arranged in a line;
a first substrate carrying robot configured to pick up substrates from the substrate loading conveyor unit and carry the substrates to a tray placed on the tray carrying unit;
a second substrate carrying robot configured to pick up substrates from a tray placed on the tray carrying unit and carry the substrates to the substrate unloading conveyor unit;
a first cassette elevator configured to receive and lift a cassette containing substrates;
a substrate carrying-out unit configured to take substrates from a cassette placed on the first cassette elevator and provide the substrates to the substrate loading conveyor unit; and
a two-stage cassette loading conveyor unit including,
an upper conveyor configured to supply a cassette containing substrates to the first cassette elevator, and
a lower conveyor configured to receive an empty cassette from the first cassette elevator.

14. A substrate processing for loading and unloading a plurality of substrates on and from a tray, the substrate processing apparatus comprising:
a tray carrying unit configured to receive and carry a tray;
a substrate loading conveyor unit on which substrates to be loaded on a tray are arranged in a line;
a substrate unloading conveyor unit on which substrates unloaded from a tray are arranged in a line;
a first substrate carrying robot configured to pick up substrates from the substrate loading conveyor unit and carry the substrates to a tray placed on the tray carrying unit;
a second substrate carrying robot configured to pick up substrates from a tray placed on the tray carrying unit and carry the substrates to the substrate unloading conveyor unit;
a first cassette elevator configured to receive and lift a cassette containing substrates; and
a substrate carrying-out unit configured to take substrates from a cassette placed on the first cassette elevator and provide the substrates to the substrate loading conveyor unit, the substrate carrying-out unit including,
a base plate having substrate support pins to receive a substrate,
an end effector configured to pick up a substrate from a cassette placed on the first cassette elevator; and
a substrate shift module having first and second seats symmetrically formed in one piece, the first seat being configured to receive a substrate from the end effector and place the substrate on the substrate support pins, the second seat being configured to transfer the substrate from the substrate support pins to the substrate loading conveyor unit.

15. The substrate processing apparatus of claim 14, wherein the end effector is movable forward and backward by a cylinder unit and comprises a vacuum holder at an end to hold a substrate by vacuum.

16. A substrate processing apparatus for loading and unloading a plurality of substrates on and from a tray, the substrate processing apparatus comprising:
a tray carrying unit configured to receive and carry a tray;
a substrate loading conveyor unit on which substrates to be loaded on a tray are arranged in a line;
a substrate unloading conveyor unit on which substrates unloaded from a tray are arranged in a line;
a first substrate carrying robot configured to pick up substrates from the substrate loading conveyor unit and carry the substrates to a tray placed on the tray carrying unit;
a second substrate carrying robot configured to pick up substrates from a tray placed on the tray carrying unit and carry the substrates to the substrate unloading conveyor unit;
a first cassette elevator configured to receive and lift a cassette containing substrates; and
a substrate carrying-out unit configured to take substrates from a cassette placed on the first cassette elevator and provide the substrates to the substrate loading conveyor unit, the substrate carrying-out unit including,
a base plate disposed between the first cassette elevator and the substrate loading conveyor unit, the base plate having substrate support pins to support a bottom side of a substrate,
an end effector disposed on the base plate to pick up a substrate from a cassette placed on the first cassette elevator, and
a substrate shift module disposed on the base plate around the substrate support pins and the end effector, front and rear sides of the substrate shift module being opened not to interfere with the end effector and the substrate support pins, the substrate shift module having first and second seats symmetrically formed in one piece,
wherein the first seat is configured to receive a substrate from the end effector and place the substrate on the substrate support pins, and the second seat is configured to transfer the substrate from the substrate support pins to the substrate loading conveyor unit.

17. A substrate processing apparatus for loading and unloading a plurality of substrates on and from a tray, the substrate processing apparatus comprising:
a tray carrying unit configured to receive and carry a tray;
a substrate loading conveyor unit on which substrates to be loaded on a tray are arranged in a line;
a substrate unloading conveyor unit on which substrates unloaded from a tray are arranged in a line;
a first substrate carrying robot configured to pick up substrates from the substrate loading conveyor unit and carry the substrates to a tray placed on the tray carrying unit;
a second substrate carrying robot configured to pick up substrates from a tray placed on the tray carrying unit and carry the substrates to the substrate unloading conveyor unit;
a second cassette elevator configured to receive and lift an empty cassette; and
a substrate carrying-in unit configured to take substrates from the substrate unloading conveyor unit and place the substrates in an empty cassette placed on the second cassette elevator; and
a two-stage cassette unloading conveyor unit including,
an upper conveyor configured to supply an empty cassette to the second cassette elevator, and
a lower conveyor configured to receive a cassette containing substrates from the second cassette elevator.

18. A substrate processing apparatus for loading and unloading a plurality of substrates on and from a tray, the substrate processing apparatus comprising:
a tray carrying unit configured to receive and carry a tray;
a substrate loading conveyor unit on which substrates to be loaded on a tray are arranged in a line;
a substrate unloading conveyor unit on which substrates unloaded from a tray are arranged in a line;
a first substrate carrying robot configured to pick up substrates from the substrate loading conveyor unit and carry the substrates to a tray placed on the tray carrying unit;
a second substrate carrying robot configured to pick up substrates from a tray placed on the tray carrying unit and carry the substrates to the substrate unloading conveyor unit;
a first cassette elevator configured to receive and lift a cassette containing substrates;
a substrate carrying-out unit configured to take substrates from a cassette placed on the first cassette elevator and provide the substrates to the substrate loading conveyor unit;
a cassette loading conveyor unit configured to supply a cassette containing substrates to the first cassette elevator;
a second cassette elevator configured to receive and lift an empty cassette;
a substrate carrying-in unit configured to take substrates from the substrate unloading conveyor unit and place the substrates in an empty cassette placed on the second cassette elevator; and
a cassette unloading conveyor unit configured to supply an empty cassette to the second cassette elevator.

19. A substrate processing method for loading and unloading a plurality of substrates on and from a tray, the substrate processing method comprising:
performing an substrate unloading operation using a substrate carrying robot by picking up a row or column of processed substrates from a tray at a time and carrying the processed substrates to a substrate unloading conveyor unit; and
performing a substrate loading operation using another substrate carrying robot by picking up a corresponding number of substrates at a time from a substrate loading conveyor unit and carrying the corresponding number of substrates to the empty row or column of the substrates of the tray.

20. The substrate processing method of claim 19, further comprising:
    carrying the substrates from the substrate unloading conveyor unit into an empty cassette; and
    feeding substrates to the substrate loading conveyor unit which is empty after the substrate loading operation in a way of picking up a substrate from a cassette and carrying the substrate to the substrate loading conveyor.

21. The substrate processing method of claim 19, wherein after substrates of a tray are completely replaced by the substrate loading operation and the substrate unloading operation, the tray is carried to a loadlock chamber through upper feed roller tracks, and a tray carried from the loadlock chamber is placed on lower feed roller tracks and is then lifted to the upper feed roller tracks for replacing substrates of the tray.

* * * * *